(12) United States Patent
Koganei

(10) Patent No.: US 10,623,137 B2
(45) Date of Patent: Apr. 14, 2020

(54) TRANSMISSION APPARATUS AND ERROR CORRECTION METHOD

(71) Applicant: FUJITSU LIMITED, Kawasaki-shi, Kanagawa (JP)

(72) Inventor: Yohei Koganei, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 90 days.

(21) Appl. No.: 16/058,577

(22) Filed: Aug. 8, 2018

(65) Prior Publication Data

US 2019/0052401 A1 Feb. 14, 2019

(30) Foreign Application Priority Data

Aug. 14, 2017 (JP) .................................. 2017-156665

(51) Int. Cl.
| | | |
|---|---|---|
| G06F 11/10 | (2006.01) | |
| G11C 29/52 | (2006.01) | |
| G11C 29/04 | (2006.01) | |
| H04L 1/00 | (2006.01) | |
| H03M 13/00 | (2006.01) | |
| H03M 13/11 | (2006.01) | |

(52) U.S. Cl.
CPC ....... H04L 1/0045 (2013.01); H03M 13/1105 (2013.01); H03M 13/616 (2013.01); H03M 13/1154 (2013.01); H03M 13/1194 (2013.01)

(58) Field of Classification Search
CPC ......... H03M 13/1154; H03M 13/1194; H03M 13/1105; H03M 13/616; H04L 1/0045
See application file for complete search history.

(56) References Cited

U.S. PATENT DOCUMENTS

| | | | |
|---|---|---|---|
| 2009/0031186 A1 | 1/2009 | Matsumoto et al. | |
| 2012/0198307 A1* | 8/2012 | Kibe | H03M 13/11 |
| | | | 714/758 |
| 2014/0281819 A1* | 9/2014 | Wood | G11C 16/349 |
| | | | 714/773 |
| 2016/0336965 A1* | 11/2016 | Koganei | H03M 13/616 |

FOREIGN PATENT DOCUMENTS

| | | |
|---|---|---|
| JP | 2015-103866 | 6/2015 |
| JP | 2016-213701 | 12/2016 |
| WO | 2006/106841 | 10/2006 |

OTHER PUBLICATIONS

Sarah Johnson et al., "Spatially Coupled Repeat-Accumulate Codes", IEEE Communications Letters, vol. 17, No. 2, pp. 373-376 (4 pages), Feb. 2013.

* cited by examiner

*Primary Examiner* — Guy J Lamarre
(74) *Attorney, Agent, or Firm* — Fujitsu Patent Center

(57) ABSTRACT

A transmission apparatus includes, a receiving circuit that receives a reception signal indicating a coded bit string, a decoding circuit that decodes and corrects the bit string by using a spatially-coupled low density parity check code constituted by arranging element matrixes stepwise in a diagonal direction, a parity check matrix of the spatially-coupled low density parity check code including at least one element matrix having at least one of a number of rows and a number of columns different from a number of rows and a number of columns of other element matrixes when each sparse matrix constituting the parity check matrix is regarded as an element matrix, and outputs the corrected bit string.

9 Claims, 12 Drawing Sheets

TRANSMISSION APPARATUS AND ERROR CORRECTION METHOD

CROSS-REFERENCE TO RELATED APPLICATION

This application is based upon and claims the benefit of priority of the prior Japanese Patent Application No. 2017-156665, filed on Aug. 14, 2017, the entire contents of which are incorporated herein by reference.

FIELD

The embodiments discussed herein are related to a transmission apparatus and an error correction method.

BACKGROUND

In the field of transmission apparatuses, there have been known various techniques for improving the characteristics of error correction process for correcting errors in a receive signal. For example, there has been proposed a technique in which a cyclic permutation matrix is arranged so as to satisfy a predetermined weight distribution, and a low density parity check matrix formed to gradually increase the weight of a row is used to achieve efficient erasure correction of data having a short code length (see, e.g., International Publication Pamphlet No. WO 2006/106841). In addition, there has been proposed a technique in which the size of a region of a root matrix is extended and then a nonzero element is moved so that the density of the nonzero element becomes uniform in the extended region to generate a desired parity check matrix at a high speed (see, e.g., Japanese Laid-open Patent Publication No. 2015-103866). Further, there has been proposed a technique for improving the error correction characteristics by setting a large column weight in the column direction of an element matrix corresponding to the end of the bit string of a signal among element matrixes of a spatially-coupled low density parity check code (see, e.g., Japanese Laid-open Patent Publication No. 2016-213701).

It may be possible to improve the error correction characteristics by using the parity check matrix having the large column weight in the column direction of the element matrix corresponding to the end of the bit string of the signal. In this aspect, however, the parity check matrix will contain parts with different column weights. When a difference in column weights in the parity check matrix gets larger, a shift in processing time due to the column weight difference may occur. Thus, a circuit for executing an error correction process may not be easily implemented by a semiconductor device or the like.

Related techniques are disclosed in, for example, International Publication Pamphlet No. WO 2006/106841, Japanese Laid-open Patent Publication Nos. 2015-103866 and 2016-213701, and Sarah Johnson and Gottfried Lechner, "Spatially Coupled Repeat-Accumulate Codes", *IEEE COMMUNICATIONS LETTERS*, VOL. 17, NO. 2, February 2013.

SUMMARY

According to an aspect of the embodiments, a transmission apparatus includes, a receiving circuit that receives a reception signal indicating a coded bit string, a decoding circuit that decodes and corrects the bit string by using a spatially-coupled low density parity check code constituted by arranging element matrixes stepwise in a diagonal direction, a parity check matrix of the spatially-coupled low density parity check code including at least one element matrix having at least one of a number of rows and a number of columns different from a number of rows and a number of columns of other element matrixes when each sparse matrix constituting the parity check matrix is regarded as an element matrix, and outputs the corrected bit string.

The object and advantages of the invention will be realized and attained by means of the elements and combinations particularly pointed out in the claims. It is to be understood that both the foregoing general description and the following detailed description are exemplary and explanatory and are not restrictive of the invention, as claimed.

DESCRIPTION OF EMBODIMENTS

Hereinafter, a transmission apparatus and an error correction method according to embodiments will be described with reference to the drawings. It is to be, however, noted that the technical scope of the present disclosure is not limited to these embodiments.

(Spatially-Coupled Low Density Parity Check Code)

Figure 1A:
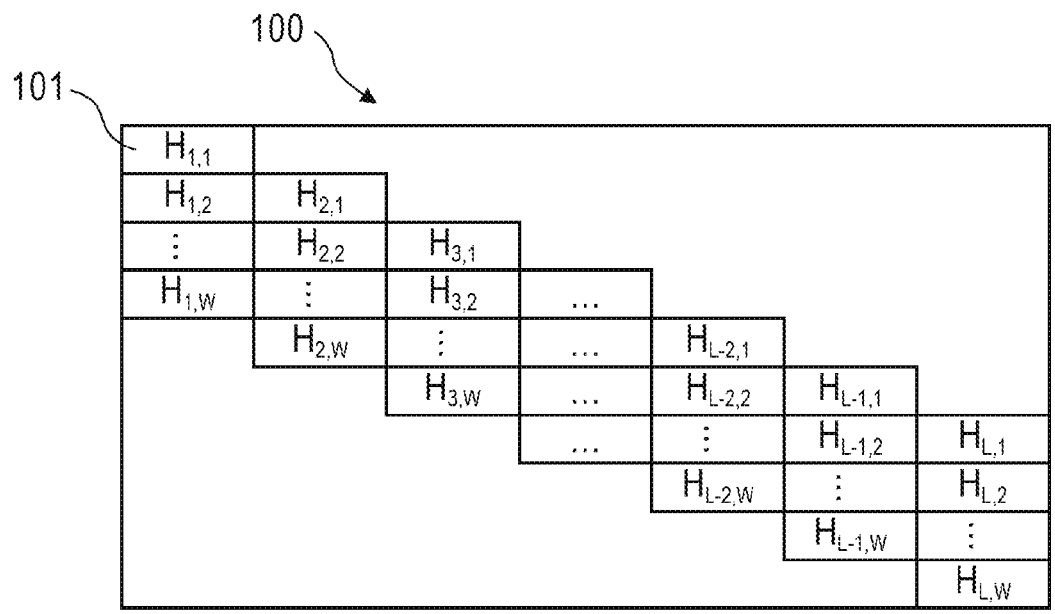
FIG. 1A is a view illustrating an example of a spatially-coupled low density parity check code.
Figure 1B:
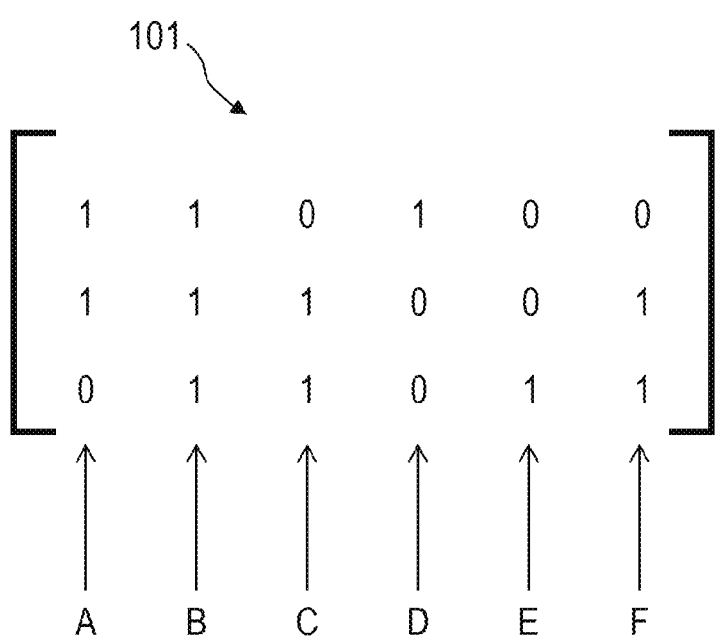
FIG. 1B is a view illustrating an example of element matrixes illustrated in FIG. 1A.

FIG. 1A is a view illustrating an example of a spatially-coupled low density parity check code and FIG. 1B is a view illustrating an example of element matrixes illustrated in FIG. 1A.

A spatially-coupled low density parity check (LDPC) code 100 is a matrix used to detect an error when a received signal is decoded and correct the detected error. The spatially-coupled LDPC code 100 includes element matrixes 101 that are arranged W by W adjacent to each other in a row from the upper left end to lower right end of the spatially-coupled LDPC code 100. That is, the spatially-coupled low density parity check code 100 is constituted by the element matrixes 101 arranged stepwise in the diagonal direction. In the spatially-coupled LDPC code 100, a so-called zero matrix having a value of "0" is arranged in an area where no element matrix 101 is arranged.

At the left end of the spatially-coupled LDPC code 100, W element matrixes 101 denoted by $H_{1,1}$ to $H_{1,W}$ are sequentially arranged in the column direction with the element matrix 101 denoted by $H_{1,1}$ located at the upper left end of the spatially-coupled LDPC code 100. W element matrixes 101 denoted by $H_{2,1}$ to $H_{2,W}$ are sequentially arranged in the column direction on the right side of the W element matrixes 101 denoted by $H_{1,1}$ to $H_{1,W}$. The upper end element matrix 101 denoted by $H_{2,1}$ is located on the same row as the element matrix 101 denoted by $H_{1,2}$. W element matrixes 101 denoted by $H_{3,1}$ to $H_{3,W}$ are sequentially arranged in the column direction on the right side of the W element matrixes 101 denoted by $H_{2,1}$ to $H_{2,W}$. The upper end element matrix 101 denoted by $H_{3,1}$ is located on the same row as the element matrix 101 denoted by $H_{2,2}$.

Each of the element matrixes 101 is arranged to be shifted downward from an element matrix 101 arranged in the column adjacent to the left side by the number of rows of the adjacent element matrix 101. At the right end of the spatially-coupled LDPC code 100, W element matrixes 101 denoted by $H_{L,1}$ to $H_{L,W}$ are arranged with the upper end element matrix 101 denoted by $H_{L,1}$ located on the same row as the element matrix 101 denoted by $H_{(L-1),2}$. The lower end element matrix 101 denoted by $H_{L,W}$ is located at the lower right end of the spatially-coupled LDPC code 100.

Each of the element matrixes 101 is a 3×6 matrix. In general, an element matrix is a matrix having a size of length×width=(N−K)×N in which "0" and "1" are arranged. In the example illustrated in FIG. 1B, N=6 and K=3, but in typical, each of K and N is a natural number of hundreds to thousands, and K<N. In the spatially-coupled LDPC code 100, all the element matrixes 101 have the same size. That is, in each of the element matrixes 101, K and N are the same number.

The number of "1" in the column direction of the element matrix 101 is called column weight. In the element matrix 101, the column weight of the first column indicated by an arrow A is "2", the column weight of the second column indicated by an arrow B is "3" and the column weight of the third column indicated by an arrow C is "2". The column weight of the fourth column indicated by an arrow D is "1", the column weight of the fifth column indicated by an arrow E is "1" and the column weight of the sixth column indicated by an arrow F is "2".

When the spatially-coupled LDPC code 100 is used to execute an error correction process, by increasing the column weight of the element matrix 101, the accuracy of error correction, that is, the characteristics may be improved. However, when the column weight of the element matrix 101 is increased, the process load of the error correction process increases, which may result in increase in scale of a processing circuit for executing the error correction process.

(Spatially-Coupled LDPC Code According to Embodiment)

Figure 2:
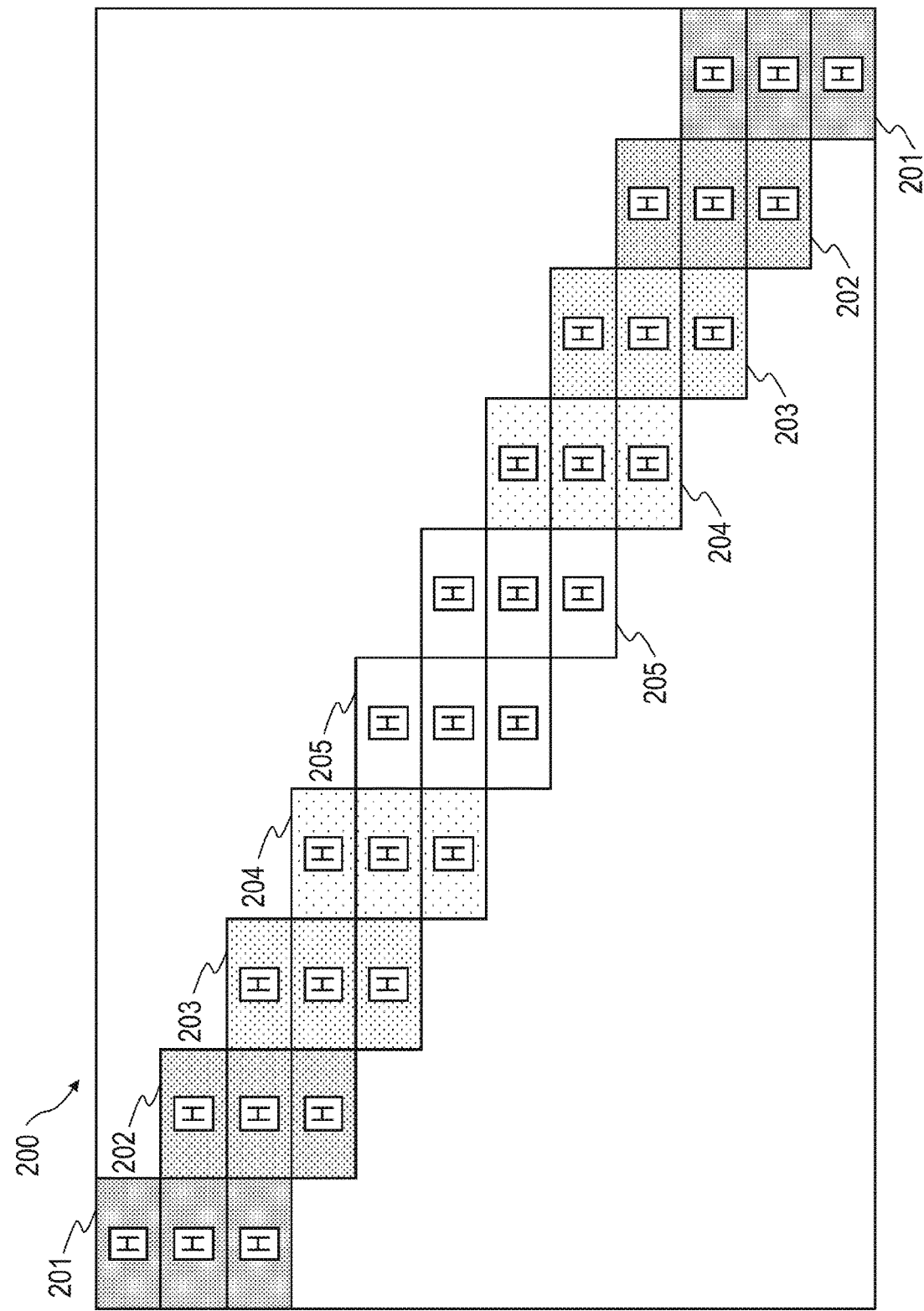
FIG. 2 is a view illustrating an example of a spatially-coupled low density parity check code according to an embodiment.

FIG. 2 is a view showing an example of a spatially-coupled LDPC code according to an embodiment.

A spatially-coupled LDPC code 200 has element matrixes 201 to 205 arranged three by three in the column direction. The element matrixes 201 are arranged at each of both ends of the spatially-coupled LDPC code 200, the element matrixes 202 are arranged inside the element matrixes 201 and the element matrixes 203 are arranged inside the element matrixes 202. The element matrixes 204 are arranged inside the element matrixes 203 and the element matrixes 205 are arranged inside the element matrixes 204, that is, in the center of the spatially-coupled LDPC code 200.

The column weight of the element matrix 201 is larger than the column weight of the element matrix 202, the column weight of the element matrix 202 is larger than the column weight of the element matrix 203, the column weight of the element matrix 203 is larger than the column weight of the element matrix 204, and the column weight of element matrix 204 is greater than the column weight of element matrix 205. In general, in the error correction process using the spatially-coupled LDPC code, the coding rate at the end portion of a signal bit string is smaller than that in the central portion thereof. Thus, the error correction first proceeds from the end portion. The spatially-coupled LDPC code 200 provides the strengthened effect of correcting an error from the end portion of the signal bit string when the element matrix 201 having the largest column weight is arranged at both ends and the element matrix 205 having the smallest column weight is arranged at the central portion, which makes it possible to achieve the error correction with fewer processing times.

However, in the spatially-coupled LDPC code 200, since the column weight difference between the element matrix 201 and the element matrix 205 is large, a shift in processing time due to the column weight difference may occur and there is a possibility that a circuit for executing the error correction process becomes complicated.

(Spatially-Coupled LDPC Code According to First Embodiment)

Figure 3:
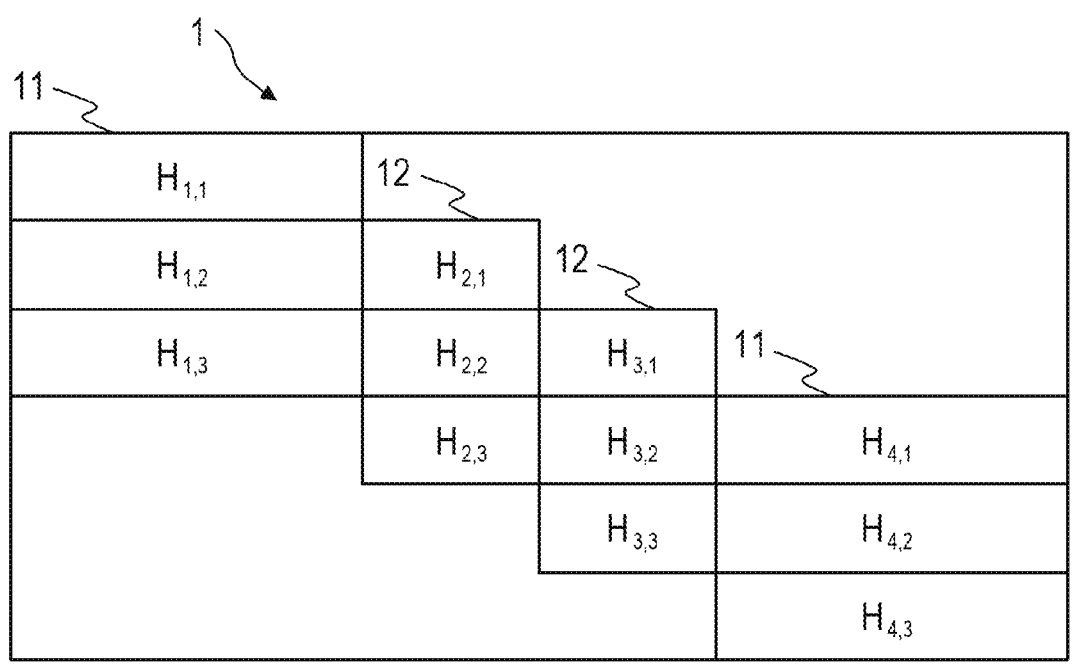
FIG. 3 is a view illustrating an example of a spatially-coupled low density parity check code according to a first embodiment.

FIG. 3 is a view illustrating an example of a spatially-coupled LDPC code according to a first embodiment.

A spatially-coupled LDPC code 1 has element matrixes 11 and 12 arranged three by three in the column direction. The element matrixes 11 denoted by $H_{1,1}$ to $H_{1,3}$ and $H_{4,1}$ to $H_{4,3}$ are arranged at both ends of the spatially-coupled LDPC code 1, respectively, and the element matrixes 12 denoted by $H_{2,1}$ to $H_{2,3}$ $H_{3,1}$ to $H_{3,3}$ are arranged inside the element matrixes 11, that is, at the center of the spatially-coupled LDPC code 1.

The column weight of the element matrix 11 is substantially the same as the column weight of the element matrix 12. The number of rows of the element matrix 11 is the same as the number of rows of the element matrix 12. However, the number of columns of the element matrix 11 is larger than the number of columns of the element matrix 12. When the number of columns of the element matrix 11 located near both ends having a large contribution to the error correction process is larger than the number of columns of the element matrix 12 positioned at the center, the spatially-coupled LDPC code 1 may use the effect of spatial coupling to improve the characteristics of the error correction process.

(Spatially-Coupled LDPC Code According to Second Embodiment)

Figure 4:
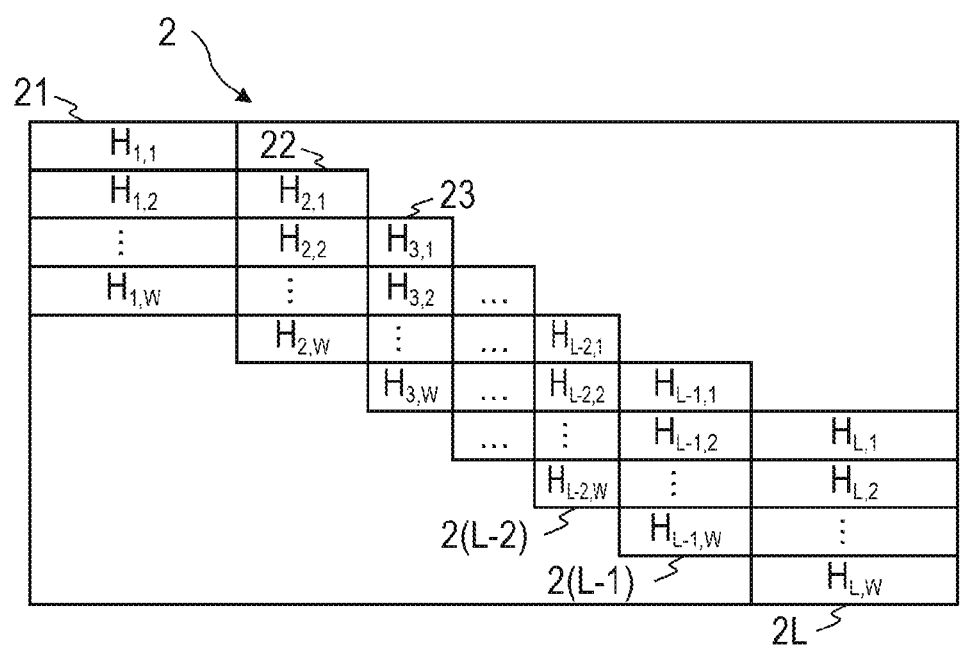
FIG. 4 is a view illustrating an example of a spatially-coupled low density parity check code according to a second embodiment.

FIG. 4 is a view illustrating a spatially-coupled LDPC code according to a second embodiment.

A spatially-coupled LDPC code 2 is a generalized spatially-coupled LDPC code 1 according to the first embodiment. The spatially-coupled LDPC code 2 has element matrixes of L columns. That is, the spatially-coupled LDPC code 2 has W element matrixes 21 denoted by $H_{1,1}$ to $H_{1,W}$, W element matrixes 22 denoted by $H_{2,1}$ to $H_{2,W}$, and W element matrixes 23 denoted by $H_{3,1}$ to $H_{3,W}$. The spatially-coupled LDPC code 2 further has W element matrixes 2(L−2) denoted by $H_{(L-2),1}$ to $H_{(L-2),W}$, W element matrixes 2(L−1) denoted by $H_{(L-1),1}$ to $H_{(L-1),W}$, and W element matrixes 2L denoted by $H_{L,1}$ to $H_{L,W}$. The column weights of the element matrixes 21 to 2L are substantially the same and the number of rows of the element matrixes 21 to 2L is the same.

The spatially-coupled LDPC code 2 is formed such that the number of columns of the element matrix arranged in the column spaced apart by a first distance from the right end becomes equal to the number of columns of the element matrix arranged in the column spaced apart by the first distance from the left end. For example, the number of columns of the element matrix 21 and the number of columns of the element matrix 2L are equal to each other, the number of columns of the element matrix 22 and the number of columns of the element matrix 2(L−1) are equal to each other, and the number of columns of the element matrix 23 and the number of columns of the element matrix 2(L−2) are equal to each other. By making the number of columns of element matrixes arranged in the column spaced apart by the same distance from the left and right ends equal to each other, the spatially-coupled LDPC code 2 may be used to execute a bit string error correction process to equalize processing speeds of the LSB side and the MSB side of the bit string.

In addition, the number of columns of the element matrix 21 is larger than the number of columns of the element matrix 22, and the number of columns of the element matrix 22 is larger than the number of columns of the element matrix 23. Similarly, the spatially-coupled LDPC code 2 is formed such that the number of rows of the element matrix decreases from the end toward the center.

In addition, the number of columns of the element matrix included in the spatially-coupled LDPC code 2 is formed to be an integral multiple of the number of columns of the element matrix having the smallest number of rows. For example, when the element matrix is arranged over four columns, the ratio of the number of columns of the element matrix may be set to 2:1:1:2, 3:1:1:3, etc. When the number of columns of the element matrix is formed to be an integral multiple of the number of columns of the element matrix having the smallest number of columns, the spatially-coupled LDPC code 2 may be easily generated.

(Spatially-Coupled LDPC Code According to Third Embodiment)

Figure 5:
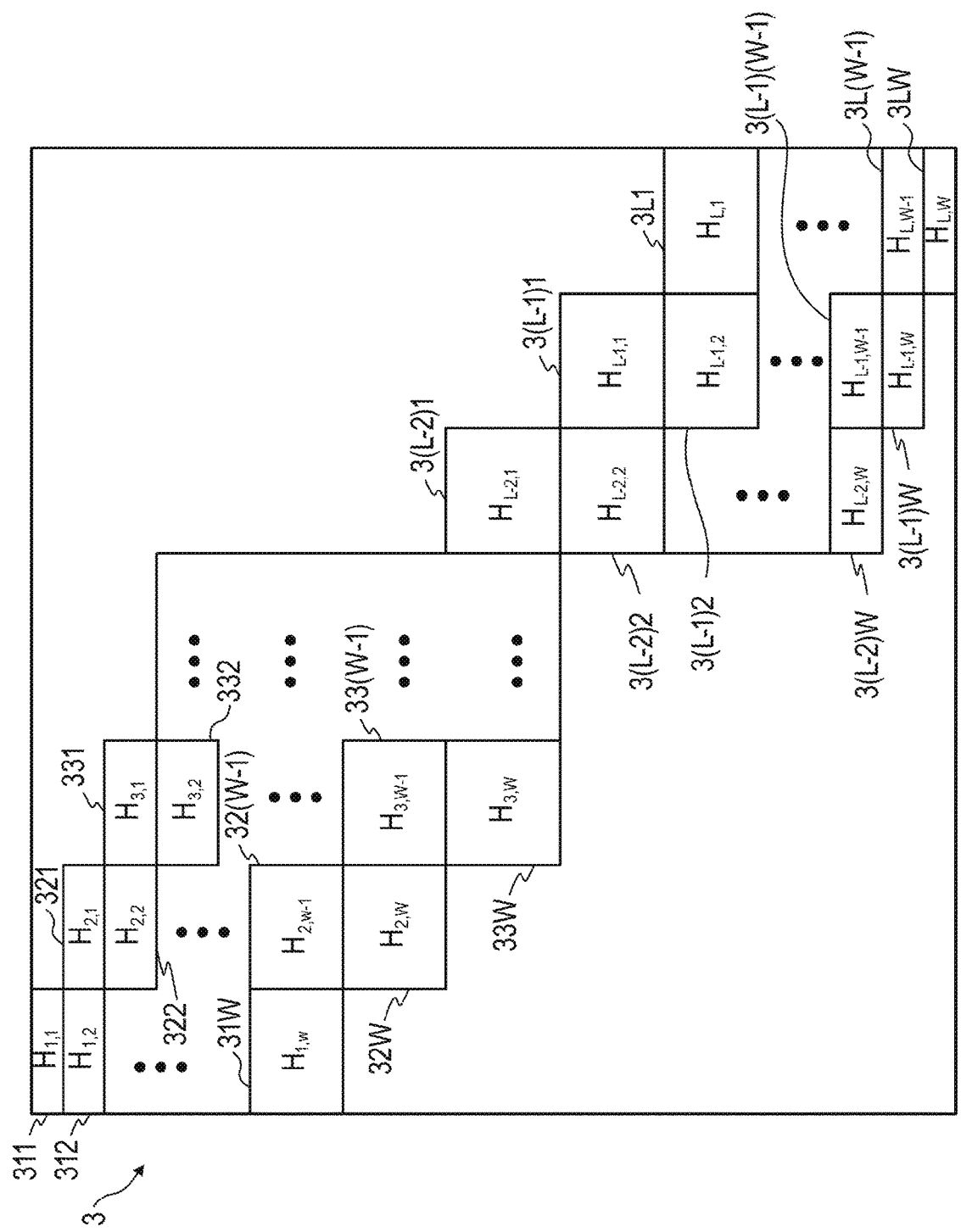
FIG. 5 is a view illustrating an example of a spatially-coupled low density parity check code according to a third embodiment.

FIG. 5 is a view illustrating a spatially-coupled LDPC code according to a third embodiment.

Similarly to the spatially-coupled LDPC code 2, a spatially-coupled LDPC code 3 has element matrixes of L columns. However, the element matrix of the spatially-coupled LDPC code 3 is different from the element matrix of the spatially-coupled LDPC code 2 in that the former has the same number of columns and the different number of rows.

Specifically, the spatially-coupled LDPC code 3 has W element matrixes 311 to 31W denoted by $H_{1,1}$ to $H_{1,W}$, W element matrixes 321 to 32W denoted by $H_{2,1}$ to $H_{2,W}$, and W element matrixes 331 to 33W denoted by $H_{3,1}$ to $H_{3,W}$. The spatially-coupled LDPC code 3 further has W element matrixes 3(L−2)1 to 3(L−2)W denoted by $H_{(L-2),1}$ to $H_{(L-2),W}$, W element matrixes 3(L−1)1 to 3(L−1)W denoted by $H_{(L-1),1}$ to $H_{(L-1),W}$, and W element matrixes 3L1 to 3LW denoted by $H_{L,1}$ to $H_{L,W}$. The column weights of the element matrixes 311 to 31W and so on of the spatially-coupled LDPC code 3 are substantially the same. The number of columns of the element matrixes 311 to 31W and so on of the spatially-coupled LDPC code 3 is the same.

The spatially-coupled LDPC code 3 is formed such that the number of rows of the element matrix arranged in the column spaced apart by a second distance from the upper end becomes equal to the number of rows of the element matrix arranged in the column spaced apart by the second distance from the lower end. For example, the number of rows of the element matrix 312 is larger than the number of rows of the element matrix 311, the number of rows of the element matrix 322 is larger than the number of rows of the element matrix 321, and the number of rows of the element matrix 332 is larger than the number of rows of the element matrix 331. In the meantime, the number of rows of the element matrix 3(L−2)2 is smaller than the number of rows of the element matrix 3(L−2)1, the number of rows of the element matrix 3(L−1)2 is smaller than the number of rows of the element matrix 3(L−1)1, and the number of rows of the element matrix 3L2 is smaller than the number of rows of the element matrix 3L1. By making the number of columns of element matrixes arranged in the row spaced apart by the same distance from the upper and lower ends equal to each other, the spatially-coupled LDPC code 3 may be used to execute a bit string error correction process to equalize processing speeds of the LSB side and the MSB side of the bit string.

In the spatially-coupled LDPC code 3, the number of rows of the element matrixes arranged in the same row is the same. For example, the element matrix 312 and the element matrix 321 have the same number of rows, and the element matrix 322 and the element matrix 331 have the same number of rows. In addition, the element matrix 3(L−2)2 and the element matrix 3(L−1)1 have the same number of rows, and the element matrix 3(L−1)2 and the element matrix 3L1 have the same number of rows.

In addition, since the spatially-coupled LDPC code 3 is formed such that the number of rows of the element matrix increases from the end toward the center, the constraint condition of the corresponding signal bit string more strongly acts. That is, the spatially-coupled LDPC code 3 may improve the characteristics of the correction process by setting the number of rows of the element matrix located at the center to be larger than the number of rows of the element matrix located at the end.

In addition, the number of rows of the element matrix included in the spatially-coupled LDPC code 3 is formed to be an integral multiple of the number of rows of the element matrix having the smallest number of rows. For example, when the element matrix is arranged over four rows, the ratio of the number of rows of the element matrix may be set to 2:1:1:2, 3:1:1:3, etc. When the number of rows of the element matrix is formed to be an integral multiple of the number of rows of the element matrix having the smallest number of rows, the spatially-coupled LDPC code 3 may be easily generated.

(Spatially-Coupled LDPC Code According to Fourth Embodiment)

Figure 6:
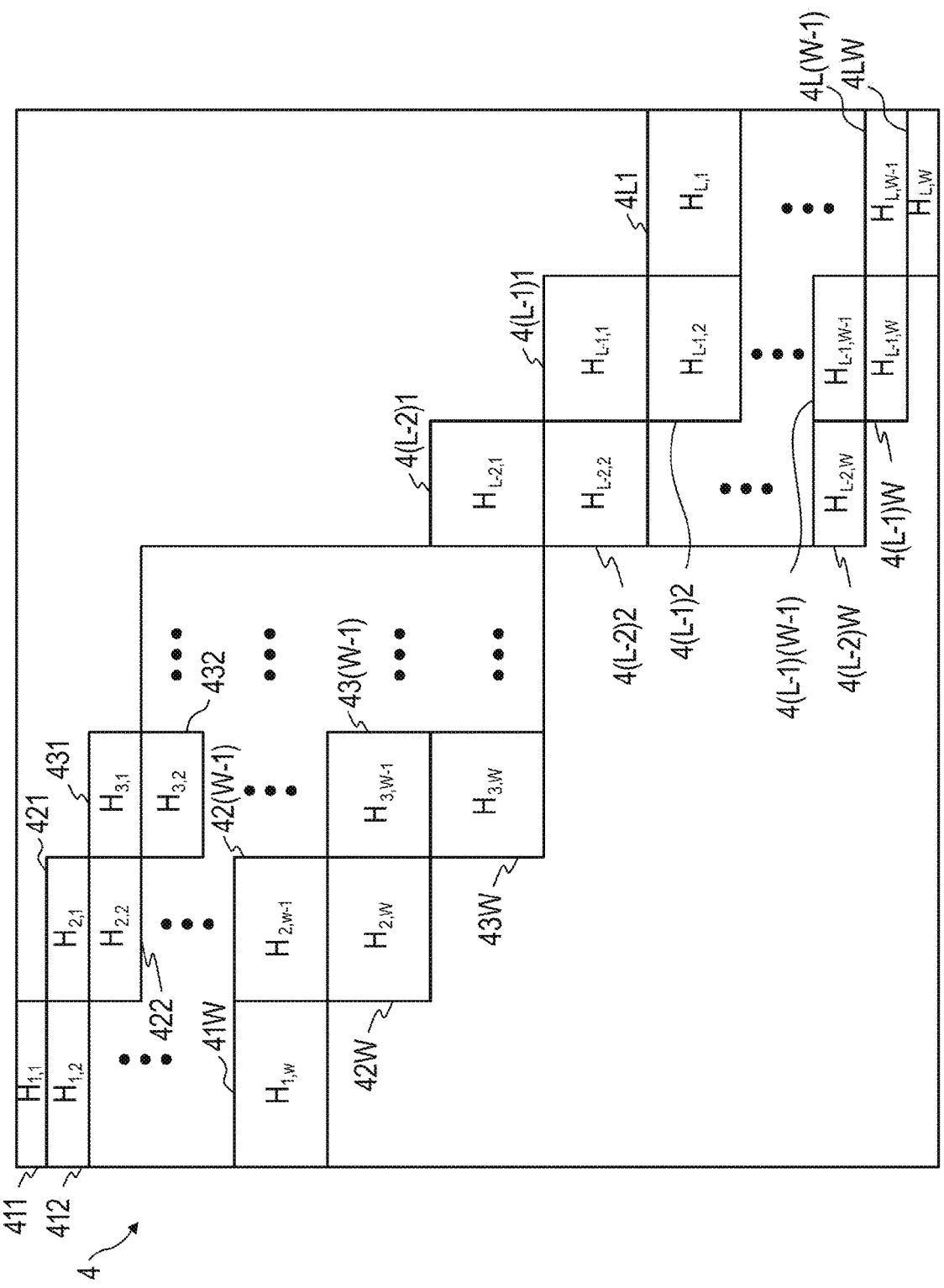
FIG. 6 is a view illustrating an example of a spatially-coupled low density parity check code according to a fourth embodiment.

FIG. 6 is a view illustrating a spatially-coupled LDPC code according to a fourth embodiment.

Similarly to the spatially-coupled LDPC code 2, a spatially-coupled LDPC code 4 has element matrixes of L columns. However, the element matrix of the spatially-coupled LDPC code 4 is different from the element matrix of the spatially-coupled LDPC code 2 in that the former has the different number of columns and the different number of rows.

Specifically, the spatially-coupled LDPC code 4 has W element matrixes 411 to 41W denoted by $H_{1,1}$ to $H_{1,W}$, W element matrixes 421 to 42W denoted by $H_{2,1}$ to $H_2$" and W element matrixes 431 to 43W denoted by $H_{3,1}$ to $H_{3,W}$. The spatially-coupled LDPC code 4 further has W element matrixes 4(L−2)1 to 4(L−2)W denoted by $H_{(L-2),1}$ to $H_{(L-2),W}$, W element matrixes 4(L−1)1 to 4(L−1)W denoted by $H_{(L-1),1}$ to $H_{(L-1),W}$, and W element matrixes 4L1 to 4LW denoted by $H_{L,1}$ to $H_{L,W}$. The column weights of the element matrixes 411 to 41W and so on of the spatially-coupled LDPC code 4 are substantially the same.

The number of rows of the element matrix 412 is larger than the number of rows of the element matrix 411, the number of rows of the element matrix 422 is larger than the number of rows of the element matrix 421, and the number of rows of the element matrix 432 is larger than the number of rows of the element matrix 431. In the meantime, the number of rows of the element matrix 4(L−2)2 is smaller than the number of rows of the element matrix 4(L−2)1, the number of rows of the element matrix 4(L−1)2 2 is smaller than the number of rows of the element matrix 4(L−1)1, and the number of rows of the element matrix 4L2 is smaller than the number of rows of the element matrix 4L1. Similarly, the spatially-coupled LDPC code 4 is formed such that the number of rows of the element matrix increases from the end towards the center.

In the spatially-coupled LDPC code 4, the number of rows of the element matrixes arranged in the same row is the same. For example, the element matrix 412 and the element matrix 421 have the same number of rows, and the element matrix 422 and the element matrix 431 have the same number of rows. In addition, the element matrix 4(L−2)2 and the element matrix 4(L−1)1 have the same number of rows, and the element matrix 4(L−1)2 and the element matrix 4L1 have the same number of rows.

The spatially-coupled LDPC code 4 may improve the characteristics of the correction process by being formed such that the number of columns of the element matrix decreases from the end toward the center and the number of rows of the element matrix increases from the end toward the center.

(Method of Generating Spatially-Coupled LDPC Code According to Embodiment)

Figure 7:
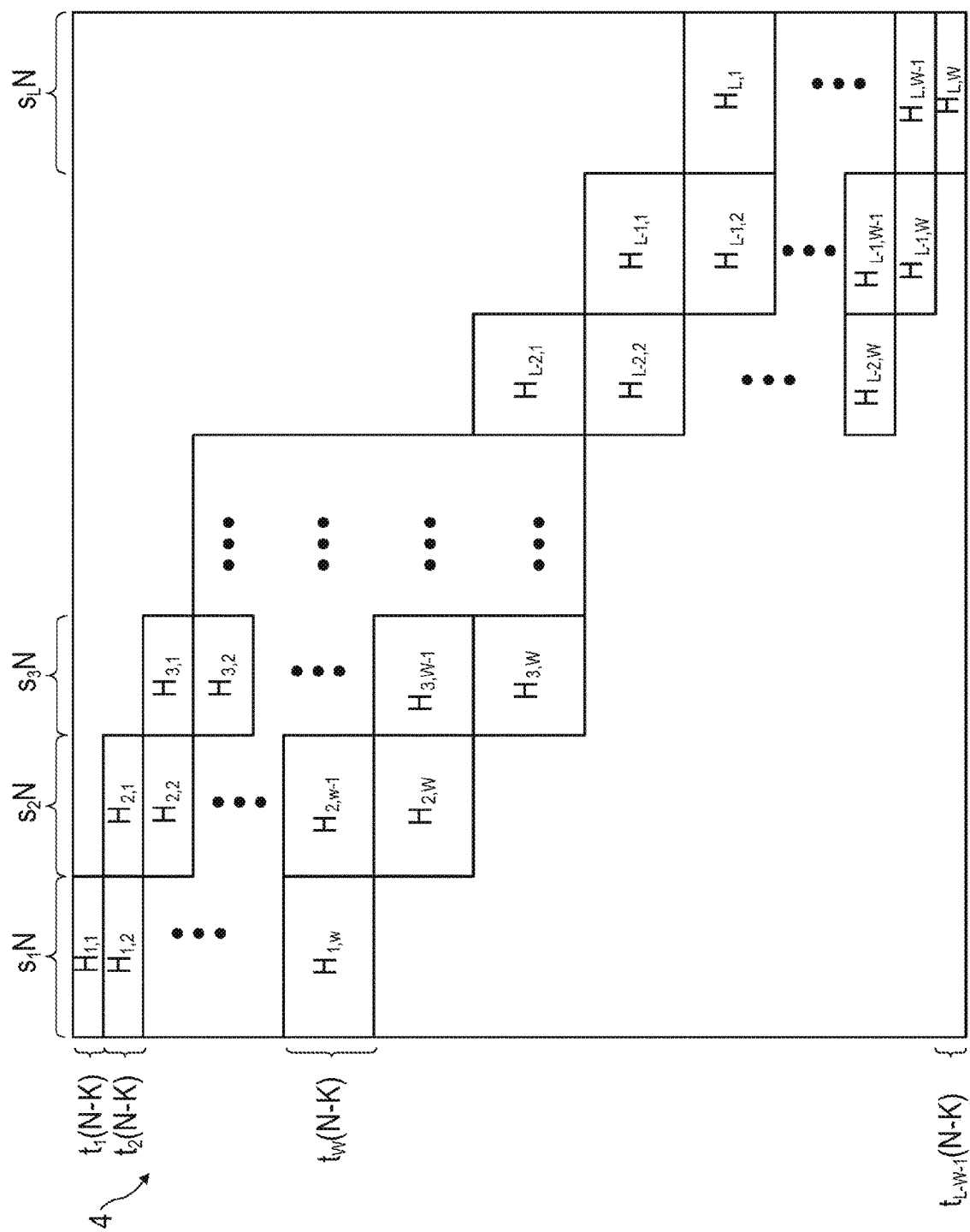
FIG. 7 is a view for explaining a method of generating the spatially-coupled low density parity check code illustrated in FIG. 6.

FIG. 7 is a view for explaining a method of generating the spatially-coupled LDPC code 4. In FIG. 7, K is the number of columns of the reference element matrix, L is the length of spatial coupling, N is a difference between the number of columns and the number of rows of the reference element matrix, W is the width of spatial coupling, $s_1$ to $s_{L,W-1}$ are shape variables in the column direction, and $t_1$ to $t_L$ are shape variables in the column direction. Each of the shape variables $s_l$ and $t_i$ shows the following relationship.

[Eq. 1]

$$\sum_{l=1}^{L} s_l = L, \quad \sum_{j=1}^{L+W-1} t_j = L + W - 1. \quad (1)$$

Since each of the shape variables $s_l$ and $t_i$ shows the relationship of Equation (1), the coding rate $r_{SC}$ of the spatially-coupled LDPC code 4 is uniquely determined by the constants K, L, N and W regardless of values of the shape variables $s_l$ and $t_i$, as expressed by the following equation (2).

[Eq. 2]

$$r_{SC} = \frac{LK - (W-1)(N-K)}{LN}. \quad (2)$$

The bit erasure probability $p^{(I)}$ in the entire codeword when an iterative decoding process is executed (I) times is expressed by the following equation (3).

[Eq. 3]

$$p^{(I)} = \frac{\varepsilon}{L} \sum_{l=1}^{L} s_l \sum_{w=1}^{W} v_{lw}(q_{lw}^{(I-1)}). \quad (3)$$

Where, $\varepsilon$ is the initial value of the bit erasure probability $p^{(I)}$, and $q^{(I)}_{lw}$ is expressed by the following equation (4). $q^{(I)}_{lw}$ is calculated alternately with $p^{(I-1)}_{lw}$ expressed by the following equation (4) while sequentially incrementing the decoding count I from 0.

[Eq. 4]

$$p_{lw}^{(I)} = \varepsilon \lambda_{lw}(q_{lw}^{(I-1)}) \prod_{w' \neq w} v_{lw'}(q_{lw'}^{(I-1)}), \quad (4)$$

$$q_{lw}^{(I)} = 1 - \rho_{lw}(1 - p_{lw}^{(I)}) \prod_{l' \neq l} h_{l'w}(1 - p_{l'w}^{(I)}).$$

In Equations (3) and (4), $v_{lw}(x)$ is a function indicating a distribution of the ratio of "1" in each row of the element matrix, that is, a node distribution of column weights, and is expressed by the following equation (5).

[Eq. 5]

$$v_{lw}(x) = v_{lw,1}x + v_{lw,2}x^2 + \ldots + v_{lw,i}x^i + \ldots, \quad (5)$$

$$\sum_i v_{lw,i} = 1$$

In Equation (4), $h_{lw}(x)$ is a function indicating a distribution of the ratio of "1" in each column of the element matrix, that is, a node distribution of column weights, and is expressed by the following equation (6).

[Eq. 6]

$$h_{lw}(x) = h_{lw,1}x + h_{lw,2}x^2 + \ldots + h_{lw,i}x^i + \ldots. \quad (6)$$

$$\sum_i h_{lw,i} = 1$$

In Equation (4), $\lambda_{lw}(x)$ is a function indicating a distribution when the ratio of "1" in each row of the element matrix is converted into the ratio of edge in a protograph, that is, an edge distribution of column weights, and is expressed by the following equation (7).

[Eq. 7]

$$\lambda_{lw}(x) = \lambda_{lw,1}x + \lambda_{lw,2}x + \ldots + \lambda_{lw,i}x^{i-1} + \ldots, \quad (7)$$
$$\sum_i \lambda_{lw,i} = 1$$

Figure 8:
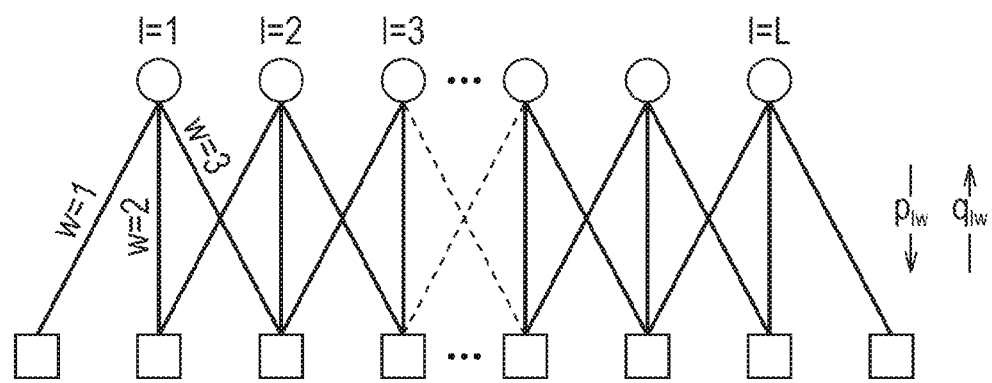
FIG. 8 is a view illustrating an example of a protograph.

FIG. 8 is a view illustrating an example of a protograph which is also referred to as a Tanner graph. In FIG. 8, a circle corresponds to the row of a parity check matrix, a square corresponds to the column of the parity check matrix, and a straight line connecting the circle and the square is called edge and corresponds to "1" included in the parity check matrix.

In Equation (4), $\rho_{lw}(x)$ is a function indicating a distribution when the ratio of "1" in each column of the element matrix is converted into the ratio of edge in a protograph, that is, an edge distribution of column weights, and is expressed by the following equation (8).

[Eq. 8]

$$\rho_{lw}(x) = \rho_{lw,1}x + \rho_{lw,2}x + \ldots + \rho_{lw,i}x^{i-1} + \ldots. \quad (8)$$
$$\sum_i \rho_{lw,i} = 1$$

The function $v_{lw}(x)$ expressed by Equation (5) and the function $\lambda_{lw}(x)$ expressed by Equation (7), and the function $h_{lw}(x)$ expressed by Equation (6) and the function $\rho_{lw}(x)$ expressed by Equation (8), are respectively correlated as expressed by the following equation (9). That is, the function $v_{lw}(x)$ and the function $\lambda_{lw}(x)$ correlate with each other and the function $h_{lw}(x)$ and the function $\rho_{lw}(x)$ correlate with each other.

[Eq. 9]

$$v_{lw,i} = \frac{\lambda_{lw,i}/i}{\sum_j \lambda_{lw,j}/j}, \quad h_{lw,i} = \frac{\rho_{lw,i}/i}{\sum_j \rho_{lw,j}/j}. \quad (9)$$

The four functions of Equations (5) to (8) correlate with each other by being given a constraint condition expressed by the following equation (10) and only the function $v_{lw}(x)$ expressed by Equation (5) is an independent function. Equation (1) includes the first equation described above and the second equation described below.

[Eq. 10]

$$\overline{h_{lw}} = \frac{s_l N}{t_{l+w-1}(N-K)} \sum_i v_{lw,i} \cdot i, \quad (10)$$
$$h_{lw}(x) = (\lceil \overline{h_{lw}} \rceil - \overline{h_{lw}})x^{\lfloor \overline{h_{lw}} \rfloor} + (\overline{h_{lw}} - \lfloor \overline{h_{lw}} \rfloor)x^{\lfloor \overline{h_{lw}} \rfloor}.$$

The shape variables $s_l$ and $t_i$ are determined by an optimization algorithm such as dichotomy, a genetic algorithm or the like such that the erasure probability $p^{(I)}$ is equal to or less than a desired threshold value of about $10^{-15}$ in the optical fiber communication until the decoding number I reaches the maximum value limit Imax of about 10 to 1000. For example, the values of the shape variables $s_l$ and $t_i$ that fix the coding rate $r_{SC}$, the length L of the spatial coupling and the width W of the spatial coupling to a desired value and maximize the initial value E of the erasure probability may be searched, together with the value of the function $v_{lw}(x)$, using the optimization algorithm.

The spatially-coupled LDPC code 2 may be calculated in the same manner as the spatially-coupled LDPC code 4 except that $t_i$ is set to "1" in Equations (1) to (10). In addition, the spatially-coupled LDPC code 3 may be calculated in the same manner as the spatially-coupled LDPC code 4 except that $s_l$ is set to "1" in Equations (1) to (10).

(Apparatus Using Spatially-Coupled LDPC According to Embodiment)

Figure 9A:
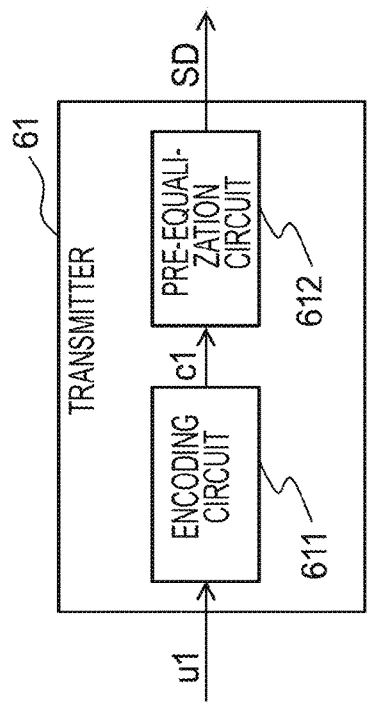
FIG. 9A is a view illustrating a communication system.
Figure 9B:
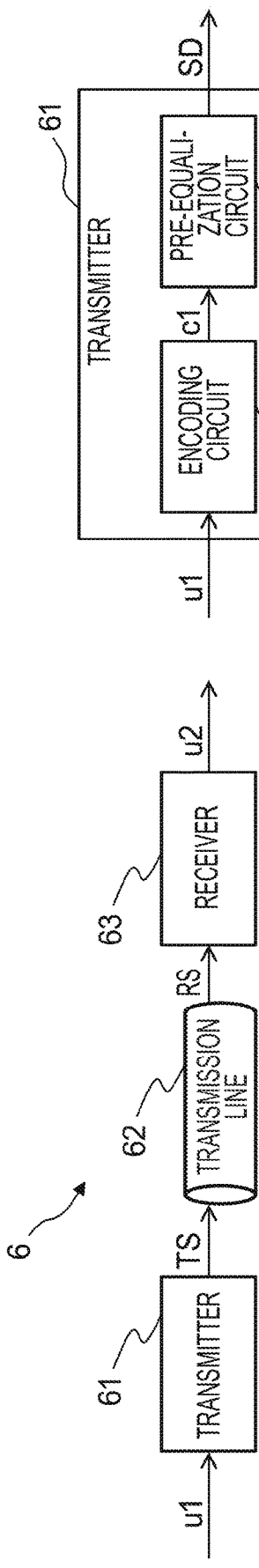
FIG. 9B is an internal circuit diagram of a transmitter illustrated in FIG. 9A.
Figure 9C:
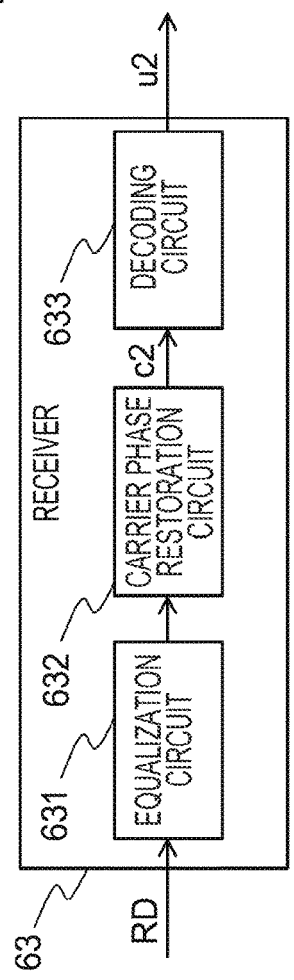
FIG. 9C is an internal circuit diagram of a receiver illustrated in FIG. 9A.
Figure 9D:
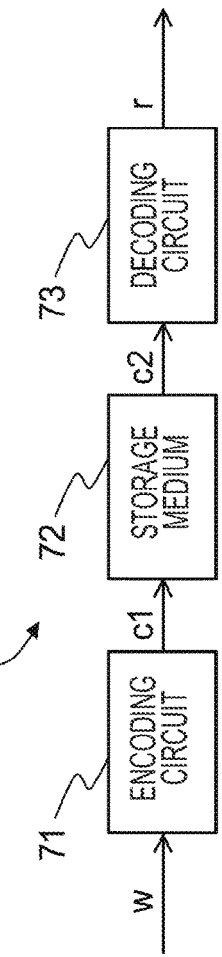
FIG. 9D is a view illustrating a storage system.

FIG. 9A is a view illustrating a communication system, FIG. 9B is an internal circuit diagram of a transmitter illustrated in FIG. 9A, FIG. 9C is an internal circuit diagram of a receiver illustrated in FIG. 9A, and FIG. 9D is a view illustrating a storage system The communication system 6 includes a transmitter 61, a transmission line 62, and a receiver 63. The transmitter 61 and the receiver 63 are an example of a transmission apparatus according to an embodiment. The transmitter 61 encodes a bit string u1 corresponding to an input signal using a generation matrix G to generate a coded bit string c1 and transmits a transmission signal TS, which is generated by performing a predetermined characteristic compensation process for the coded bit string c1, to the receiver 63 via the transmission line 62. After performing a waveform shaping process and a carrier phase restoring process for the reception signal RS, the receiver 63 uses a parity check matrix H, which is the spatially-coupled LDPC according to an embodiment, to perform an error correction process for a bit string c2 corresponding to the reception signal RS to restore a bit string u2. The generation matrix G and the parity check matrix H have a relationship of "GHT=0."

The transmitter 61 includes an encoding circuit 611 and a pre-equalization circuit 612. The encoding circuit 611 uses the generator matrix G to generate the encoded bit string c1 from the bit string u1 corresponding to the input signal and outputs the generated encoded bit string c1 to the pre-equalization circuit 612. The pre-equalization circuit 612 performs various characteristic compensation processes such as wavelength dispersion compensation and frequency offset compensation for the coded bit string c1 to generate the transmission signal TS, and transmits the generated transmission signal TS to the receiver 63 via the transmission path 62.

The receiver 63 includes an equalization circuit 631, a carrier phase restoration circuit 632, and a decoding circuit 633. The equalization circuit 631 and the carrier phase restoration circuit 632 form a receiving circuit that receives a reception signal RD indicating an encoded bit string. The equalization circuit 631 performs various waveform shaping processes such as wavelength dispersion compensation, frequency offset compensation, polarization mode dispersion compensation, and waveform distortion compensation for the reception signal RD. The carrier phase restoration circuit 632 detects a phase difference between the reception signal and a clock, and restores the reception signal indicating the coded bit string c2 based on the detected phase difference. The decoding circuit 633 uses the parity check matrix H to perform an error correction process for the bit string c2 corresponding to the restored reception signal to generate a corrected bit string u2. The decoding circuit 633 outputs the corrected bit string. The bit string u2 generated by the decoding circuit 633 corresponds to the bit string u1 input to the transmitter 61.

The storage system 7 includes an encoding circuit 71, a storage medium 72, and a decoding circuit 73. The encoding circuit 71 and the decoding circuit 73 are another example of the transmission apparatus according to the embodiment. The encoding circuit 71 uses the generation matrix G to encode a write bit string to generate the encoded bit string c1 and writes the generated encoded bit string c1 in the storage medium 72. The storage medium 72 is, for example, a semiconductor memory and stores the encoded bit string c1 written by the encoding circuit 71. The decoding circuit 73 reads the encoded bit string c2 stored in the storage medium 72 from the storage medium 72 and uses the parity check matrix H, which is the spatially-coupled LDPC according to the embodiment, to execute an error correction process to restore a read bit string r.

(Modification of Spatially-Coupled LDPC Code According to Embodiment)

The spatially-coupled LDPC code according to the embodiment is not limited to the disclosed spatially-coupled LDPC code but may include other spatially-coupled codes such as a spatially-couple repeat-accumulate (SC-RA) code described in Non-Patent Document 1. The spatially-coupled RA code has the characteristic in the error correction capability of the spatially-coupled LDPC code and is easy to process the encoding, and is suitable for practical use in applying the effect of the spatial coupling.

Figure 10:
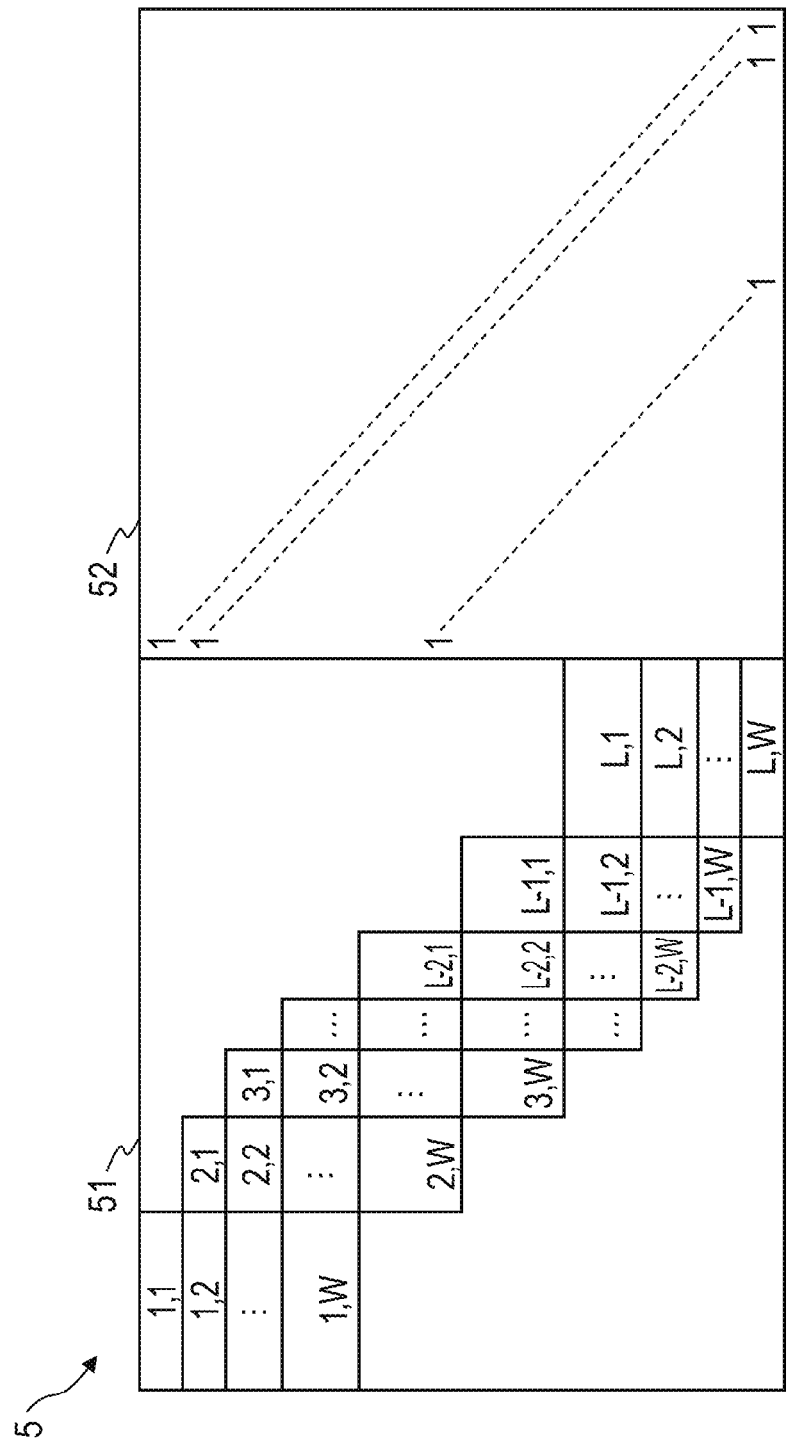
FIG. 10 is a view illustrating a spatially-coupled RA code according to an embodiment.

FIG. 10 is a view illustrating a spatially-coupled RA code according to an embodiment.

A spatially-coupled RA code 5 has a spatial coupling unit 51 and a storage unit 52 which is also called an accumulation unit. Since the spatial coupling unit 51 has the same configuration as the spatially-coupled LDPC code 4, detailed explanation thereof will not be repeated.

The storage unit 52 includes "1" arranged on a diagonal line and "1"s arranged below and adjacent to the "1" arranged stepwise on the diagonal line. In addition, the storage unit 52 further includes "1" stepwise arranged spaced apart from "1" arranged on the diagonal line. Although "1" arranged below and adjacent to the "1" arranged stepwise on the diagonal line are included in the storage unit 52, "1" may be arranged above and adjacent to the "1" arranged stepwise on the diagonal line. In addition, although the storage unit 52 further includes "1" stepwise arranged spaced apart from the "1" arranged on the diagonal line, the "1" stepwise arranged spaced apart from the "1" arranged on the diagonal line may be omitted.

(Method of Generating Spatially-Coupled LDPC Code According to Modification)

Figure 11:
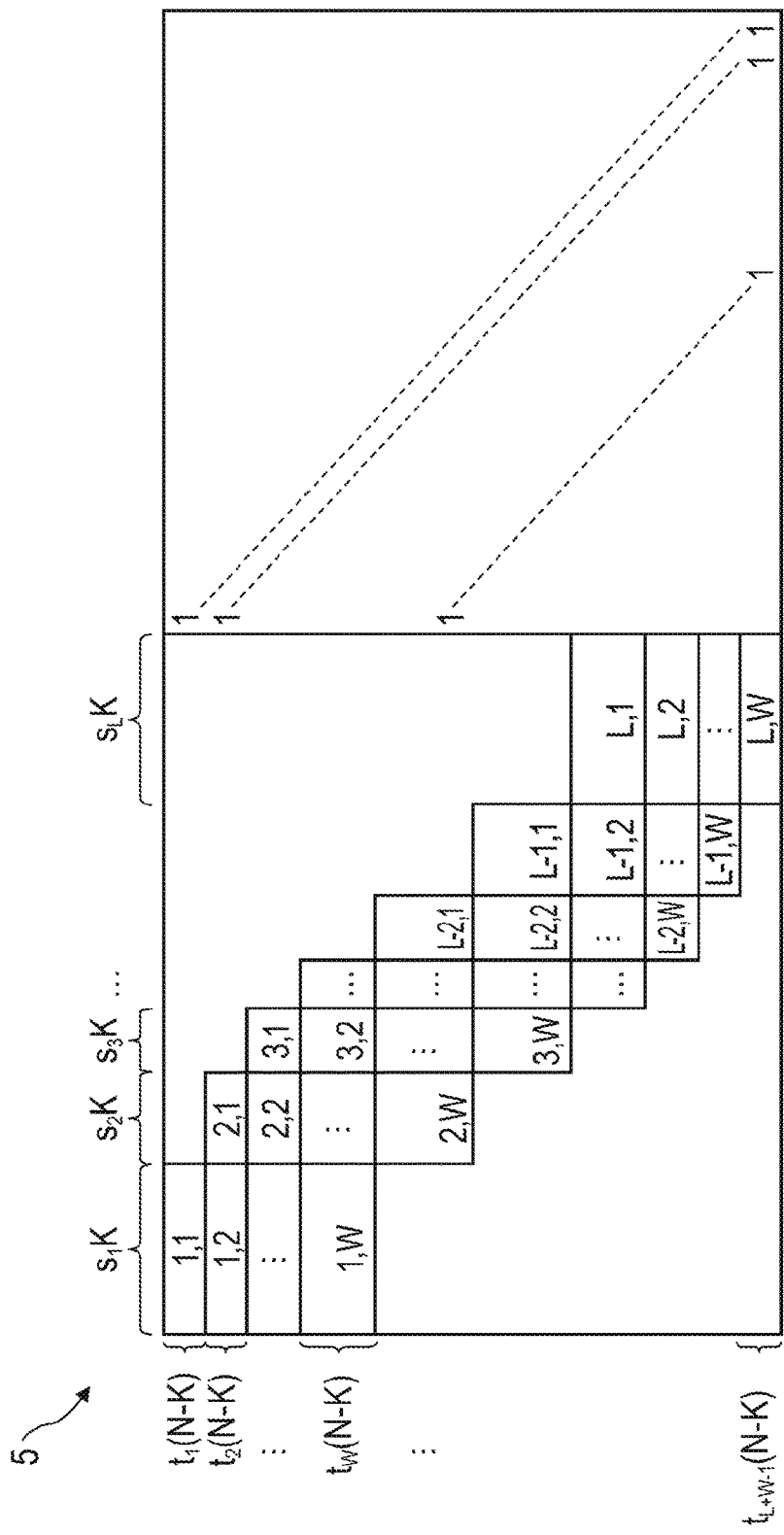
FIG. 11 is a view for explaining a method of generating a spatially-coupled RA code 5 illustrated in FIG. 10.

FIG. 11 is a view for explaining a method of generating a spatially-coupled RA code 5. The constants K, L, N, W and variables $s_1$ to $s_{L+W-1}$ and $t_1$ to $t_L$ illustrated in FIG. 11 are the same as the constants K, L, N, W and variables $s_1$ to $s_{L+W-1}$ and $t_1$ to $t_L$ illustrated in FIG. 7, respectively, and therefore, detailed explanation thereof will not be repeated.

Hereinafter, differences from the method of generating the spatially-coupled LDPC code 4 described with reference to FIG. 7 will be described. The coding rate $r_{SC}$ is defined by the following equation (11) instead of Equation (2).

[Eq. 11]

$$r_{SC} = \frac{LK}{LK + (L + W - 1)(N - K)}. \qquad (11)$$

In addition, the bit erasure probability $p^{(I)}$ in the entire codeword when the iterative decoding process is performed (I) times is defined by the following equations (12) and (13) instead of Equations (3) and (4).

[Eq. 12]

$$p^{(I)} = \qquad (12)$$
$$r_{SC}\frac{\varepsilon}{L}\sum_{l=1}^{L} s_l \prod_{w=1}^{W} v_{lw}(q_{bw}^{(I-1)}) + (1 - r_{SC})\frac{\varepsilon}{L+W-1}\sum_{j=1}^{L+W-1} t_j Q_j^{(I-1)d_p}.$$

[Eq. 13]

$$p_{lw}^{(I)} = \varepsilon \lambda_{lw}(q_{lw}^{(I-1)}) \prod_{w' \neq w} v_{lw'}(q_{bw'}^{(I-1)}), \qquad (13)$$

$$q_{lw}^{(I)} = 1 - (1 - p_{l+w-1}^{(I)})^{d_p-1} \rho_{lw}(1 - p_{lw}^{(I)}) \prod_{l' \neq l} h_{l'w}(1 - p_{l'w}^{(I)}),$$

$$P_{l+w-1}^{(I)} = \varepsilon(1 - Q_{l+w-1}^{(I-1)})^{d_p-1},$$

$$Q_{l+w-1}^{(I)} = 1 - (1 - P_{l+w-1}^{(I)})^{d_p-1} \prod_{l'} h_{l'w}(1 - p_{l'w}^{(I)}).$$

Figure 12:
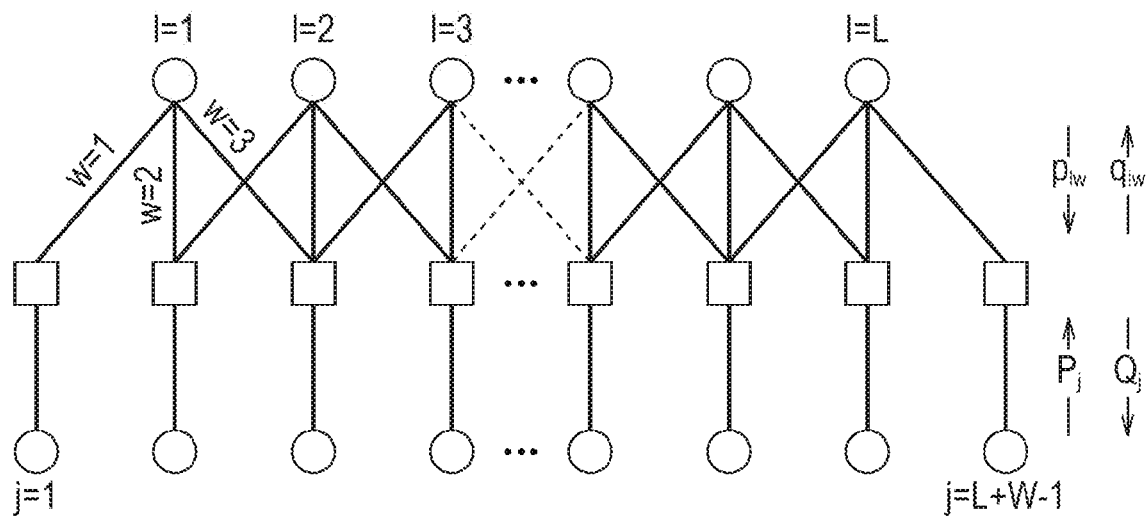
FIG. 12 is a view illustrating another example of the protograph.

In Equation (13), $P^{(I)}_{1+W-1}$ and $Q^{(I)}_{1+W-1}$ are equations corresponding to the storage unit 52, as expressed by $P_j$ and $Q_j$ in a protograph illustrated in FIG. 12.

In addition, in order to correlate the four functions of Equations (5) to (8), the following equation (14) is used instead of the first equation of Equation (10).

[Eq. 14]

$$\overline{h_{lw}} = \frac{s_l K}{t_{l+w-1}(N - K)} \sum_i v_{lw,i} \cdot i, \qquad (14)$$

The shape variables $s_l$ and $t_i$ of the spatially-coupled RA code 5 are searched, together with the value of the function $v_{lw}(x)$, by the optimization algorithm using Equations (1), (5) to (9), the second equation of Equation (10), and (11) to (14).

An apparatus using the spatially-coupled LDPC according to the modification has the same configuration as the apparatus described with reference to FIG. 9 except that the former encodes a bit string using the spatially-coupled LDPC according to the modification without using the generation matrix G, and therefore, detailed explanation thereof will not be repeated.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to an illustrating of the superiority and inferiority of the invention. Although the embodiments of the present invention have been described in detail, it should be understood that the various changes, substitutions, and alterations could be made hereto without departing from the spirit and scope of the invention.

What is claimed is:

1. A transmission apparatus comprising:
a receiving circuit configured to receive a reception signal indicating a coded bit string;
a decoding circuit configured to decode and correct the bit string when an error is detected in reception signal by using a spatially-coupled low density parity check code constituted by arranging element matrixes stepwise in a diagonal direction, a parity check matrix of the spatially-coupled low density parity check code including at least one element matrix having at least one of a number of rows and a number of columns different from a number of rows and a number of columns of other element matrixes when each sparse matrix constituting the parity check matrix is regarded as an element matrix,
the coded bit string is decoded and corrected when the reception signal is received to provide a corrected bit string, and the corrected bit string is output,
wherein a number of columns of an element matrix arranged in a column at a center of the spatially-coupled low density parity check code is smaller than a number of columns of an element matrix arranged in a column at an end of the spatially-coupled low density parity check code.

2. The transmission apparatus according to claim 1, wherein the number of columns of the element matrix included in the spatially-coupled low density parity check code is an integral multiple of a number of columns of an element matrix having a smallest number of rows.

3. The transmission apparatus according to claim 1, wherein a number of columns of an element matrix arranged in a column spaced apart by a first distance from a right end of the spatially-coupled low density parity check code is equal to a number of columns of an element matrix arranged in the column spaced apart by the first distance from a left end of the spatially-coupled low density parity check code.

4. The transmission apparatus according to claim 1, wherein a number of rows of the element matrix arranged in a row at the center of the spatially-coupled low density parity check code is larger than a number of rows of the element matrix arranged in a row at the end of the spatially-coupled low density parity check code.

5. The transmission apparatus according to claim 4, wherein a number of rows of the element matrix included in the spatially-coupled low density parity check code is an integral multiple of a number of rows of an element matrix having a smallest number of rows.

6. The transmission apparatus according to claim 4, wherein a number of rows of an element matrix arranged in a row spaced apart by a second distance from an upper end of the spatially-coupled low density parity check code is equal to a number of columns of an element matrix arranged in a row spaced apart by the second distance from a lower end of the spatially-coupled low density parity check code.

7. The transmission apparatus according to claim 1, wherein the spatially-coupled low density parity check code further includes a storage unit including "1" arranged on a diagonal line and "1" arranged adjacent one of above and below the "1" arranged on the diagonal line.

8. An error correction method, comprising:
receiving a reception signal indicating a coded bit string;
generating a parity check matrix of a spatially-coupled low density parity check code including at least one element matrix having at least one of a number of rows and a number of columns different from a number of rows and a number of columns of other element matrixes when each sparse matrix constituting the parity check matrix is regarded as an element matrix;
decoding and correcting the bit string when an error is detected in reception signal by using the spatially-coupled low density parity check code constituted by arranging element matrixes stepwise in a diagonal direction, a parity check matrix of the spatially-coupled low density parity check code including at least one element matrix having at least one of a number of rows and a number of columns different from a number of rows and a number of columns of other element matrixes when each sparse matrix constituting the parity check matrix is regarded as an element matrix,
the coded bit string is decoded and corrected when the reception signal is received to provide a corrected bit string; and
outputting the corrected bit string is output,
wherein a number of columns of an element matrix arranged in a column at a center of the spatially-coupled low density parity check code is smaller than a number of columns of an element matrix arranged in a column at an end of the spatially-coupled low density parity check code.

9. The error correction method according to claim 8, wherein the number of columns of the element matrix included in the spatially-coupled low density parity check code is an integral multiple of a number of columns of an element matrix having a smallest number of rows.

* * * * *